United States Patent
Barna et al.

(10) Patent No.: US 6,791,858 B2
(45) Date of Patent: Sep. 14, 2004

(54) POWER REDUCTION IN CMOS IMAGERS BY TRIMMING OF MASTER CURRENT REFERENCE

(75) Inventors: Sandor L. Barna, Pasadena, CA (US); Giuseppe Rossi, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/227,240

(22) Filed: Aug. 26, 2002

(65) Prior Publication Data

US 2004/0037105 A1 Feb. 26, 2004

(51) Int. Cl.[7] .............................................. G11C 17/00
(52) U.S. Cl. ...................... 365/94; 365/189.09
(58) Field of Search ................... 365/94, 225.7, 365/210, 208, 189.09

(56) References Cited

U.S. PATENT DOCUMENTS

2002/0074481 A1 * 6/2002 McGrath et al. ......... 250/208.1
2003/0076432 A1 * 4/2003 Luo et al. .................. 348/308

* cited by examiner

Primary Examiner—Thong Q. Le
(74) Attorney, Agent, or Firm—Dickstein Shapiro Morin & Oshinsky, LLP

(57) ABSTRACT

A CMOS imager has a programmable current multiplication stage provided between a master current reference and the analog circuitry. The master current of each chip can be stored on-chip, for example, in a fuse-type ROM during production testing. By programming the current multiplication stage using the stored master current information, the master current can be chosen correctly for each chip, regardless of variations in manufacturing, thereby improving the production specification to the customer.

23 Claims, 1 Drawing Sheet

POWER REDUCTION IN CMOS IMAGERS BY TRIMMING OF MASTER CURRENT REFERENCE

BACKGROUND OF THE INVENTION

1. Field of the Invention

The present invention relates to CMOS imaging devices, and more specifically, to controlling current supplied to analog circuitry of the CMOS imager.

2. Brief Description of the Related Art

Power reduction in CMOS imaging devices is an important design consideration, especially for devices targeted at handheld applications. Generally, analog power consumption is proportional to the master current of each CMOS imager chip. Analog power consumption is primarily the sum of the bias currents of each of the analog circuits. These bias currents are proportional to the master current, generated by the master current reference.

Unfortunately, this master current will vary quite significantly from chip to chip due to process (and other) variations. To ensure correct operation for all of the analog circuits on all chips without a significant yield loss, the master current reference must be designed to provide a minimum value that is three standard deviations above the distribution of master currents for CMOS chips being produced. With typical variations, this means that the average master current must often be designed to be at least 10% to 15% above the minimum required value.

Operating the master current reference so that a higher current is produced requires additional power. It would be preferable to avoid having to supply higher currents so that the CMOS imaging devices could operate at lower power requirements.

BRIEF SUMMARY OF THE INVENION

The present invention mitigates the disadvantages of the prior art by providing a programmable current multiplication stage between a master current reference and the analog circuitry. The value of master current of each chip can be stored on-chip, for example, with laser fusing in a production testing stage. By programming the current multiplication stage using the stored master current information, the master current can be chosen to be the correct value for each chip, regardless of variations in manufacturing, thereby advantageously improving the production specification to the customer.

During production test, the master current is measured by a mixed signal tester. The tester then calculates the value required to be programmed into the multiplication stage and burns this into a dummy pixel row. Once the sensor has been tested a read only memory which may conveniently be programmed with information is read at the beginning of each frame and loaded into the current multiplier at the beginning of each frame.

The programmed master current will then be accurate from chip to chip (within the accuracy of the multiplication stage), without the need for over-designing the master current reference to handle a wide range of possible current requirements. This will allow the current consumption of the CMOS imager to be reduced from the 10% to 15% higher value that is used in prior art systems to compensate for chip to chip master current variations.

These and other features and advantages of the invention will be better understood from the following detailed description, which is provided in connection with the accompanying drawings.

DETAILED DESCRIPTION OF THE INVENTION

Figure 1:
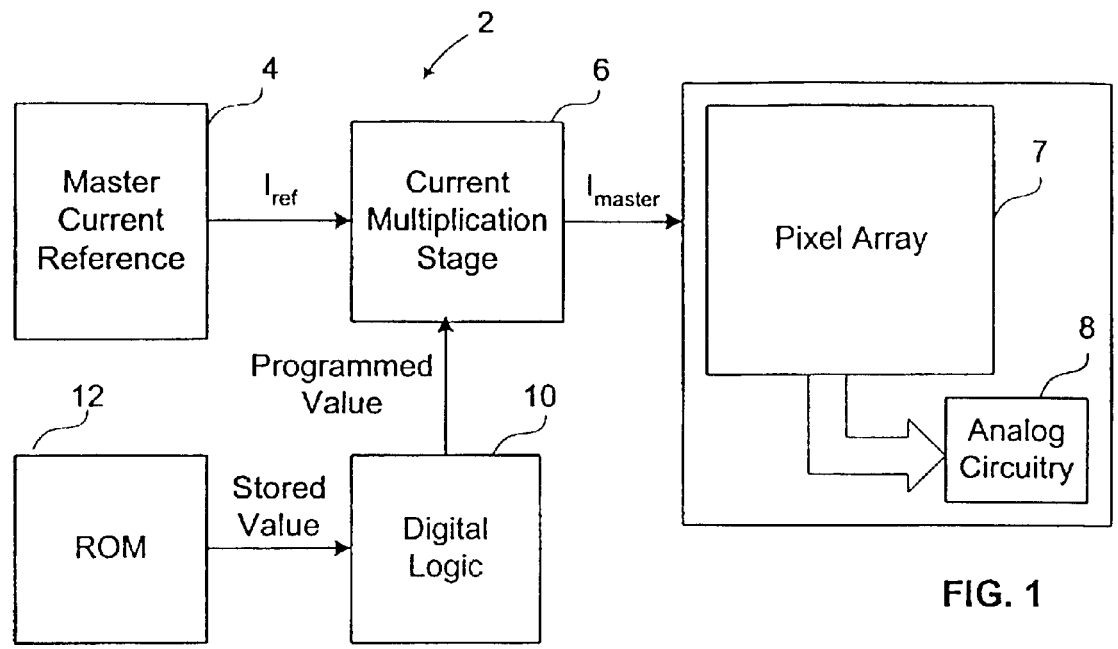
FIG. 1 illustrates a CMOS chip having a current multiplication stage according to an exemplary embodiment of the present invention.

Referring to FIG. 1, a CMOS imager chip 2 is illustrated in simplified form. Chip 2 includes a master current reference 4 supplying a master reference current $I_{ref}$ to a programmable current multiplication stage 6, which preferably supplies a master current $I_{master}$ to a pixel array 7 and associated analog circuitry 8. Current multiplication stage 6 is programmed by on-chip digital logic 10, using a value for the master current obtained from a ROM 12, which may be constructed as a fuse ROM in which data is stored in accordance with whether the fuses are blow or intact. Various types of fuse-type memory techniques can be used, such as metal lines, programmable inverters, etc.

During production test, a chip master current for a particular chip is measured using automatic testing equipment, such as a mixed signal tester. The equipment then calculates a value required to be programmed into the multiplication stage for the given chip and stores the value in ROM memory 12. Preferably, the value is burned into ROM 12 using a laser, for example.

During operation of the CMOS imaging device, the stored current information is read from ROM 12 at the beginning of each frame and the necessary master current value $I_{master}$ for the chip's analog circuitry 8 is programmed into the current multiplier 6 at the beginning of each frame by digital logic 10. Alternatively, the programmed data can be read once at the beginning of operation if on imager chip.

The master current $I_{master}$ will then be controlled accurately from chip to chip (within the accuracy of the multiplication stage) without the need for over-designing the master current reference. This allows the current consumption to be reduced from the 10% to 15% higher value required in prior art systems to accommodate chip to chip variations in master current requirements due to process variations.

Figure 2:
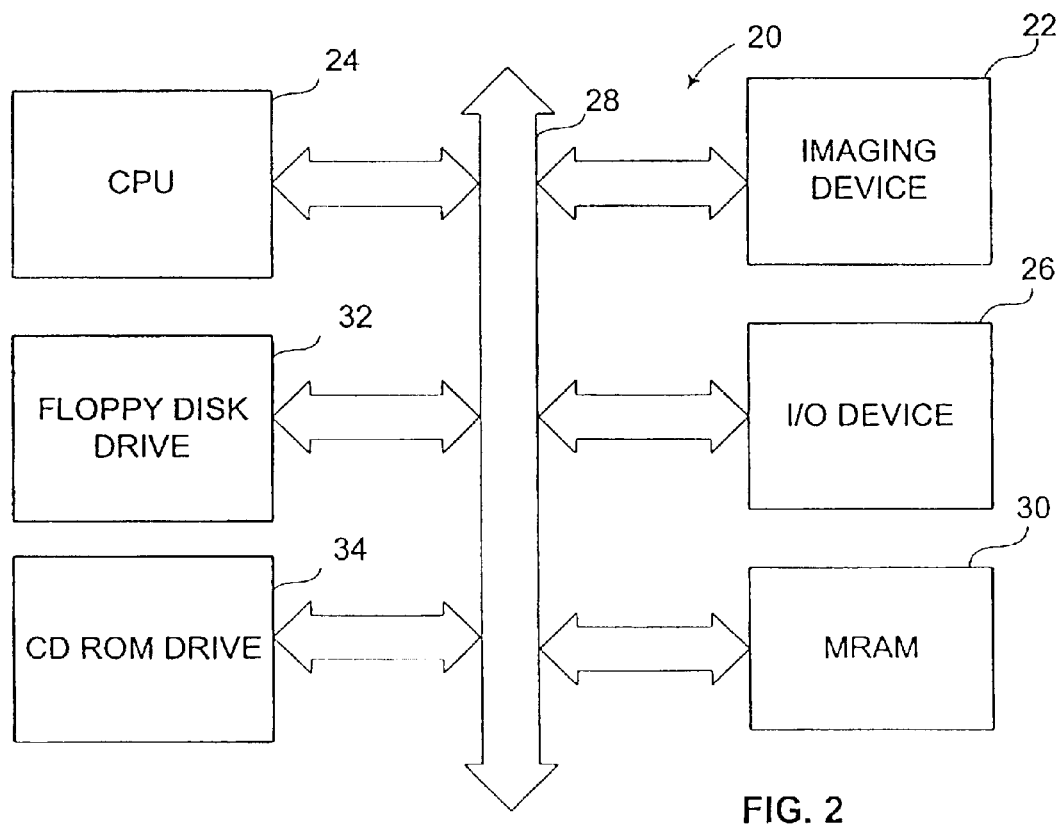
FIG. 2 illustrates a processor based system incorporating a CMOS imaging device according to an exemplary embodiment of the present invention.

FIG. 2 illustrates a processor system 20 in which an imaging device 22 emphasizing the master current control system according to the present invention is utilized. System 20 may be a stand alone system, or a system of individual, interconnectable components, each of the components incorporating one or more of the various subsystems illustrated in FIG. 2.

System 20 includes a CPU 24 and a user input/output (I/O) device 26 connected to a system bus 28. System 20 also includes MRAM 30. MRAM 30 communicates with the other components by way of system bus 28. Other optional peripheral devices include a disk drive 32 and a CD ROM drive 34. Additional optional peripheral devices could include removable memory storage devices for storing images obtained by the CMOS imager, such as memory cards, memory sticks, etc.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A CMOS imager comprising:
   a CMOS image sensor;
   a master current reference supply;
   a stored master current value for said CMOS image sensor; and
   an on-chip, programmable current multiplication stage for controlling current supplied to analog circuitry of said CMOS imager by said master current reference supply based on said stored master current value.

2. A CMOS imager as in claim 1, further comprising digital logic for programming the programmable current multiplication stage.

3. A CMOS imager as in claim 2, further comprising on-chip memory in which are stored current requirements for the analog circuitry, the current requirements being provided to the digital logic.

4. A CMOS imager as in claim 3, wherein the on-chip memory is a ROM.

5. A CMOS imager as in claim 4, wherein the ROM is laser fusible.

6. A CMOS imager as in claim 5, wherein the ROM is an unused row of pixels.

7. A CMOS imager comprising:
   a master current reference supply;
   analog circuitry; and
   a programmable current multiplication stage connected between the master current references supply and the analog circuitry and controlling a current supplied from the master current reference supply to the analog circuitry.

8. A CMOS imager as in claim 7, further comprising digital logic for programming the programmable current multiplication stage.

9. A CMOS imager as in claim 8, further comprising on-chip memory in which are stored current requirements for the analog circuitry, the current requirements being provided to the digital logic.

10. A CMOS imager as in claim 9, wherein the on-chip memory is a ROM.

11. A CMOS imager as in claim 10, wherein the ROM is laser fusible.

12. A CMOS imager as in claim 11, wherein the ROM is an unused row of pixels in a pixel array.

13. A method of controlling current required by analog circuitry of a CMOS imager, the method comprising:
   storing master current requirements of the analog circuitry in memory;
   programming an on-chip current multiplication stage using the stored current requirements; and
   using the current multiplication stage to control current supplied from a master current reference to the analog circuitry.

14. A method of controlling current as in claim 13, wherein the CMOS imager captures frames of images, and the master current requirements are read out of the memory for programming the on-chip current multiplication stage at the beginning of each frame capture.

15. A method of controlling current as in claim 13, further comprising storing said current requirements in association with production testing of the CMOS imager.

16. A method of controlling current as in claim 13, wherein the on-chip current multiplication stage is programmed using digital logic.

17. A method of controlling current as in claim 16, wherein the digital logic is on-chip.

18. A method of controlling current as in claim 13, further comprising the step of measuring a chip master current during production testing to determine the master current requirements of the analog circuitry.

19. An imaging system comprising:
   a processor; and
   a CMOS imager coupled to the processor, the CMOS imager including a master current reference, and an on-chip, programmable current multiplication stage for controlling current supplied by said master current reference to analog circuitry of the CMOS imager.

20. An imaging system as in claim 19, further comprising digital logic for programming the programmable current multiplication stage.

21. An imaging system as in claim 20, further comprising on-chip memory in which are stored current requirements for the analog circuitry, the current requirements being provided to the digital logic.

22. An imaging system as in claim 21, wherein the on-chip memory is a laser fusible ROM.

23. An imaging system as in claim 22, wherein the laser fusible ROM includes an unused row of pixels in a pixel array of the CMOS imager.

* * * * *